(12) United States Patent
Tremel et al.

(10) Patent No.: US 9,227,205 B2
(45) Date of Patent: Jan. 5, 2016

(54) PRESSURE WAVE DAMPER APPARATUS FOR CONTINUOUS LIQUID PRINTING

(71) Applicant: E I DU PONT DE NEMOURS AND COMPANY, Wilmington, DE (US)

(72) Inventors: James Daniel Tremel, Santa Barbara, CA (US); Nugent Truong, Ventura, CA (US); Matthew Stainer, Goleta, CA (US); Reid John Chesterfield, Wilmington, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 95 days.

(21) Appl. No.: 14/172,132

(22) Filed: Feb. 4, 2014

(65) Prior Publication Data
US 2015/0217304 A1    Aug. 6, 2015

(51) Int. Cl.
| | | |
|---|---|---|
| B41J 2/14 | (2006.01) |
| B41J 2/16 | (2006.01) |
| B05B 1/34 | (2006.01) |
| B05B 15/00 | (2006.01) |
| B41J 2/135 | (2006.01) |

(52) U.S. Cl.
CPC . B05B 1/34 (2013.01); B05B 15/00 (2013.01); B41J 2/135 (2013.01); B41J 2/1433 (2013.01); *B41J 2002/14379* (2013.01); *B41J 2002/14387* (2013.01); *B41J 2002/14435* (2013.01)

(58) Field of Classification Search
None
See application file for complete search history.

(56) References Cited

U.S. PATENT DOCUMENTS

2004/0118865 A1 *  6/2004  Maruyama ............ B05C 5/0225
                                                    222/1

FOREIGN PATENT DOCUMENTS

| WO | 03/006355 A1 | 1/2003 |
|---|---|---|
| WO | 03/008424 A1 | 1/2003 |
| WO | 03/040257 A1 | 5/2003 |
| WO | 03/091688 A2 | 11/2003 |
| WO | 03/091688 A3 | 11/2003 |
| WO | 2004/016710 A1 | 2/2004 |
| WO | 2007/145979 A2 | 12/2007 |
| WO | 2007/145979 A3 | 12/2007 |

* cited by examiner

Primary Examiner — Lisa M Solomon

(57) ABSTRACT

A nozzle assembly with a nozzle body cooperating with a flexible portion, the nozzle assembly also contains a throttle plate, and this combination is used to mitigate pressure variations transmitted to the nozzle assembly. The combination results in a more uniform liquid deposition during continuous liquid printing.

10 Claims, 3 Drawing Sheets

PRESSURE WAVE DAMPER APPARATUS FOR CONTINUOUS LIQUID PRINTING

BACKGROUND OF THE INVENTION

1. Field of the Invention

This invention relates to a printing apparatus for depositing a liquid composition on a surface. In particular, depositing of a liquid composition containing an organic semiconductor material on an backplane. More particularly, a nozzle assembly having a throttling plate and variable accumulation volume to mitigate pressure variations arriving at the inlet to the nozzle assembly. The mitigation of pressure variations results in improved print quality and performance of the organic semiconductor material in an electronic device.

2. Description of the Related Art

An electronic device can include a liquid crystal display ("LCD"), an organic light-emitting diode (OLED) display, or the like. The manufacture of electronic devices may be performed using solution deposition techniques. One process of making electronic devices is to deposit organic layers over a substrate by printing (e.g., ink-jet printing, continuous printing, etc.). In a printing process, the liquid composition being printed includes an organic material in a solution, dispersion, emulsion, or suspension with an organic solvent, with an aqueous solvent, or with a combination of solvents. After printing, the solvent(s) is(are) evaporated and the organic material remains to form an organic layer for the electronic device.

OLED devices utilizing one or more layers of organic semiconductor materials laminated between other supporting layers and sandwiched by two electrodes are used in many different kinds of electronic equipment.

Each organic semiconductor material is carried in a liquid composition. During manufacture of a device each liquid composition is dispensed from a dedicated nozzle assembly. The nozzle assemblies are grouped in nozzle sets, with one nozzle in each set dispensing a particular color of ink. Each nozzle assembly dispenses liquid and deposits that liquid along a longitudinal lane that extends across a backplane of the device. The nozzle assemblies in each set continuously dispense a liquid composition into a respective lane. The nozzle assemblies can be located within a printhead, and the printhead travels in a linear path in a first or forward direction, in addition to a second or reverse direction, while printing the liquid composition on the backplane.

The individual nozzle assemblies for each particular color in each nozzle assembly set are supplied as a group from a common manifold itself supplied from a suitable liquid composition supply source, or supply reservoir. The supply reservoir for each particular color is usually implemented as a communal reservoir. The supply reservoir may either directly hold a supply of liquid for the nozzle assemblies, or may hold a secondary container, such as a sealed pouch containing the particular colored liquid composition.

Liquid printing can be conducted in either non-continuous or continuous operation as disclosed in the prior art. Any pressure pulses in a non-continuous system are isolated from the dispensing of the liquid composition. One example of non-continuous liquid printing would be ink-jet printing where discreet droplets of liquid are ejected from a nozzle. Localized impulse to produce the liquid droplet is distinct and segregated from the liquid supply source, manifold, and feed tube. The arrangement in a continuous printing method does not enjoy the isolation of pressure pulses of the ink-jet printer.

Within the continuous printers, one option to eliminate or mitigate pressure pulses acting on the liquid composition is to arrange a stationary printer and move the target substrate upon which the liquid composition is deposited. Another option is to locate the manifold in close proximity to the nozzle to minimize pressure pulses traveling along the feed tube. For a moving printhead one solution has been to supply a length of tubing, having a first diameter, to act as a capacitive element to slow the liquid composition before entering the printhead. Another solution is to supply an additional length of tubing, having a second diameter, between the supply of tubing and the printhead, where the second diameter is less than the first diameter. The first length of tubing acting in a capacitive fashion while additional length of tubing acts in a resistive fashion, hence, the fluidic equivalent of an CP (Capacitive-Resistive) electronic circuit.

However, the above solutions have not met the required level of printing uniformity required for organic electronic devices. In particular, the pressure variations continue to plague the printing operations by causing at least one type of non-uniformity referred to as stitching, where heavier and lighter print deposition on the intended deposition surface result in ultimate degradation of final organic electronic devices.

In view of the foregoing it is believed additional improvement is required to improve organic electronic devices.

SUMMARY OF THE INVENTION

The present invention is directed to a nozzle assembly for a printing apparatus. The nozzle assembly includes, for example, a throttle plate and flexible portion to act as a fluidic RC (Resistor-Capacitor) to mitigate pressure variations arriving at the entry point to the apparatus.

The nozzle assembly contains at least the following elements.

A nozzle body and a nozzle disc supported by the nozzle body at a predetermined position. The nozzle disc having a nozzle opening.

A throttle plate mounted in the nozzle body at a location spaced from the nozzle disc. The throttle plate having a passage therein. The passage in the throttle plate is, for example, in fluid communication with the nozzle body, the throttle plate being operative to impart a throttling action on a flow of liquid ink passing into the nozzle body.

The nozzle body includes, for example, a flexible portion, the flexible portion being positioned between the nozzle disc and the throttle plate. The flexible portion is able to define an accumulation space within the nozzle body in response to a pressure variation in the ink, and the throttling action by the throttle plate coupled with the definition of the accumulation space is operable to mitigate pressure variations in a liquid ink.

In at least one embodiment the flexible portion forms part of the nozzle body between the nozzle disc and the throttle plate.

In at least one embodiment the flexible portion is integral with and defined by a thinner region of the material of the nozzle body.

In at least one embodiment the flexible portion is an annular member.

In at least one embodiment the flexible portion is separate from but connected to the nozzle body.

In at least one embodiment the flexible portion comprises a membrane attached to the interior surface of the nozzle body, the membrane and the surface of the nozzle body cooperating to define a closed volume having a compressible gas therein.

The compressible gas can be an inert gas.

In at least one embodiment the dimension of the passage in the throttle plate is adjustably selectable.

In at least one embodiment a nozzle assembly is attached to a damper module. The nozzle assembly contains at least a nozzle body having an inlet opening defined at a first end thereof, and a nozzle disc supported at a second end of the nozzle body, the nozzle disc having a nozzle opening therein.

The damping module contains at least a housing, a first end of the housing having an inlet opening, the first end of the housing being connectable to a supply of liquid ink, and a second end connectable to the inlet opening of the nozzle body. The damping module also contains a throttle plate mounted in the housing at a location spaced from the first end thereof, the throttle plate having a passage therein. The passage in the throttle plate being in fluid communication with the inlet opening in the nozzle body when the damping module is connected thereto. The throttle plate being operative to impart a throttling action on a flow of liquid ink conducted through the housing, and the housing having a flexible portion positioned between the throttle plate and the second end of the housing, the flexible portion being able to define an accumulation space within the housing in response to a pressure variation in the ink.

The throttling action by the throttle plate coupled with the definition of the accumulation space being operable to mitigate pressure variations in a liquid ink being conducted to the nozzle body.

BRIEF DESCRIPTION OF THE DRAWINGS

The invention will be more fully understood from the following detailed description, taken in connection with the accompanying drawings, which form a part of this application and in which.

Figure 1:
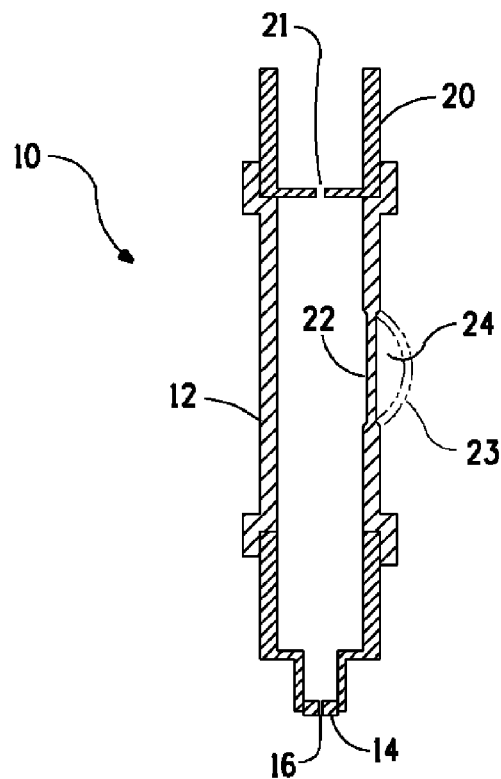
FIG. 1 represents an embodiment of the present invention with a nozzle assembly having a flexible portion and a throttle plate.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION OF THE INVENTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims.

DEFINITIONS AND CLARIFICATION OF TERMS

Before addressing details of embodiments described below, some terms are defined or clarified.

The term "annular" is intended to mean of, relating to, or forming a ring. Annular can be an open or closed ring, wherein the closed ring defines a closed volume such as a hollow ring balloon or hollow doughnut-shape. Annular can also mean a portion of a ring, this portion being either an open or closed portion.

The term "damping" is intended to mean reduction in amplitude of a variable when the variable is outside a desired set-point or desired level of the variable.

The term "disc" is used to describe an element at or near the effluent portion of a nozzle assembly. The disc may be removably attached to the nozzle assembly in order to facilitate substitution or replacement of one disc for another.

The term "electronic device" or sometimes "organic electronic device" is intended to mean a device including one or more organic semiconductor layers or materials.

The term "flexible" is intended to mean capable of bending or being bent, easily changed.

The term "ink" is used to describe a liquid for printing, where the liquid can be a solution, dispersion, or suspension.

The term "membrane" is intended to mean a flexible material having limited or no transport capability across the thickness of the membrane. One example being limited or no gas diffusion across the thickness of the membrane.

The term "nozzle assembly" is intended to mean a nozzle structure having several elements.

The term "substrate" is used to describe a surface in which printing liquid is placed after leaving a nozzle assembly.

The term "throttle" is intended to mean to regulate and especially to restrict the flow of a fluid.

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic cell, and semiconductive member arts.

Description of Printing Apparatus

Throughout the following detailed description similar reference characters refers to similar elements in all figures of the drawings.

FIG. 1 represents a nozzle assembly 10 having a nozzle body 12, the nozzle assembly 10 being adapted to deposit a liquid ink onto a surface (not shown) as the nozzle assembly 10 is displaced with respect to the surface, motion of the nozzle assembly 10 acting to impose pressure variations within a liquid ink being supplied to the nozzle assembly 10. The nozzle body 12 contains a disc 14 at or near one end of the nozzle assembly 10 with this disc 14 having an opening 16. The opening 16 in at least one embodiment is located in the center of the disc 14. A throttle plate 20 is located at or near the end of nozzle assembly 10 but opposite of the location of the disc 14. The throttle plate 20 contains a passage 21, this passage 21 can have fixed dimensions, or in at least one embodiment a variable dimension using a set screw (not shown) to adjust the dimensions of passage 21. In addition, the throttle plate 20 may be removable from the nozzle body 12, different throttle plates 20 each having a distinct passage 21 may be used to accommodate different liquid inks, also called liquid compositions, used in a printing operation utilizing the nozzle assembly 10.

The nozzle body 12 has, for example, a flexible portion 22, the flexible portion 22 being positioned between the disc 14 and the throttle plate 20. The flexible portion 22 may be a thin portion of nozzle body 12 capable of being expanded to a position 23 in response to a pressure variation in the liquid ink. In at least one embodiment the thin portion of the nozzle body 12 may be less than 90 percent of the nominal thickness of the nozzle body 12; in another embodiment, less than 80 percent of the nominal thickness of the nozzle body 12; in another embodiment, less than 70 percent of the nominal thickness of the nozzle body 12; in another embodiment, less than 60 percent of the nominal thickness of the nozzle body 12; in another embodiment, less than 50 percent of the nominal thickness of the nozzle body 12.

In at least one embodiment the flexible portion 22 is an annular member which may occupy some, or the entire, circumference of the nozzle body 12. The difference between original position of flexible portion 22 and expanded position 23 defines an accumulation space 24 within the nozzle body 12 whereby the throttling action by the throttle plate 20 coupled with the definition of the accumulation space 24 is operable to mitigate pressure variations in the liquid ink.

Figure 2:
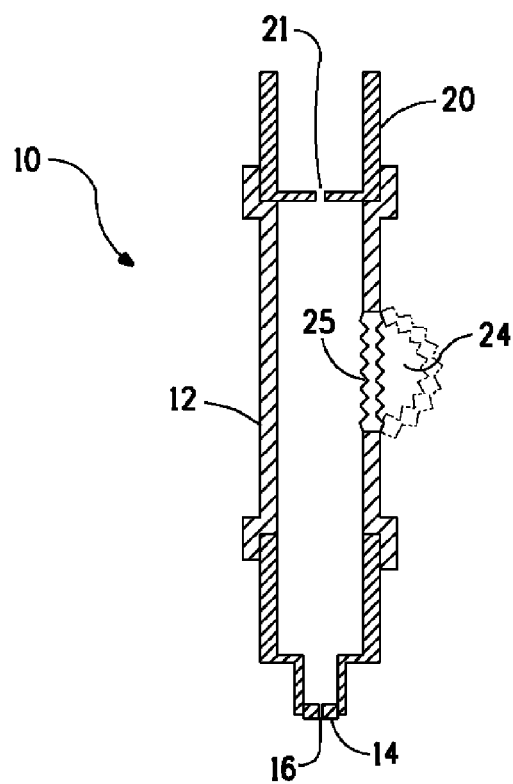
FIG. 2 represents an embodiment of the present invention with a nozzle assembly having a separate flexible portion connected to a body of the nozzle assembly.

FIG. 2 represents at least one embodiment where a flexible portion 25 is separate from but connected to the nozzle body 12. The material of flexible portion 25 can be any material capable of flexing in response to pressure, the material may be selected from but is not limited to metals, thermoplastic and thermoset polymers.

Figure 3A:
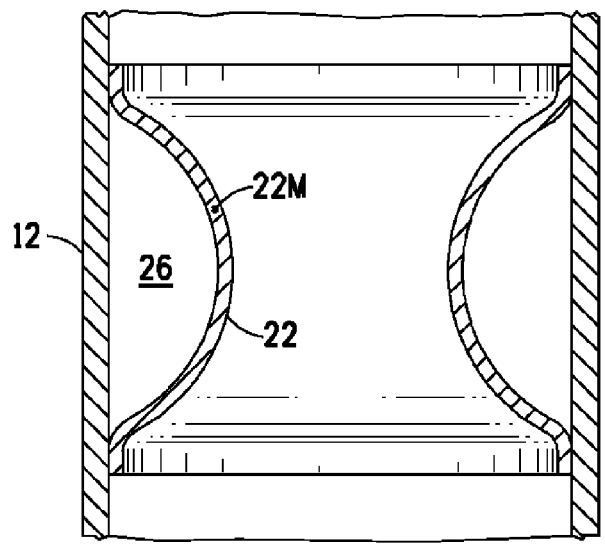
FIG. 3A represents an embodiment of the present invention with a flexible portion attached to an interior wall of the nozzle assembly.
Figure 3B:
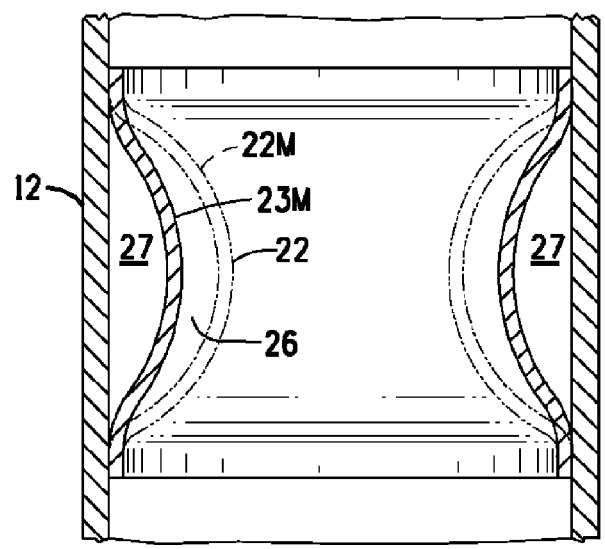
FIG. 3B represents an embodiment of the present invention where the flexible portion of FIG. 3A is compressed.

FIGS. 3A and 3B represent at least one embodiment where the flexible portion 22 entails a membrane 22M attached to interior surface of the nozzle body 12, where the space between the membrane 22M and the interior wall of nozzle body 12 defines a volume 26 containing a compressible gas. The compressible gas may be selected from but is not limited to inert gases such as nitrogen. FIG. 3B denotes the condition where an increase of pressure within the nozzle body 12 has compressed the membrane 22M and associated volume 26 to a position 23M and volume 27, where volume 27 is less than 26. Although not shown, when a decrease in pressure occurs within the nozzle body 12 membrane 22M expands so the volume 27 is greater than volume 26.

Figure 4:
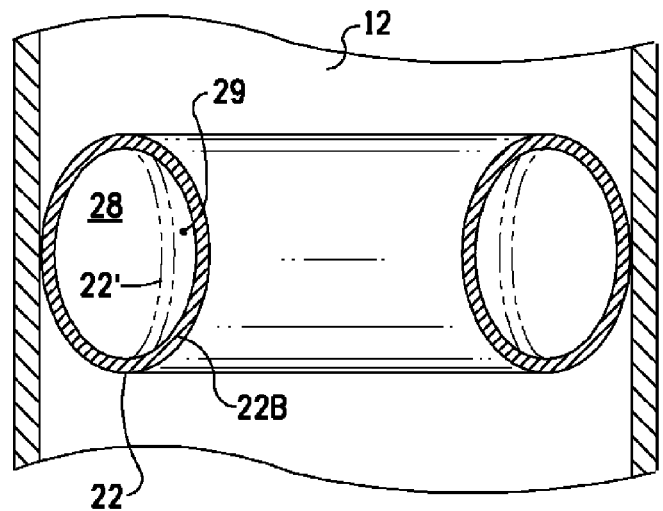
FIG. 4 represents an embodiment of the present invention with an annular configuration of a flexible portion attached to interior wall of the nozzle assembly.

FIG. 4 represents at least one embodiment where the flexible portion 22 can be in the form of an annular balloon, or doughnut-shaped, element 22B containing the compressible gas. An outer portion of the element 22B can contact the interior wall of the nozzle body 12. An initial position of the element 22B defines a volume 28, while an increase of pressure within the nozzle body 12 compresses the element 22B by a volume 29, where final volume is volume 28 minus volume 29. Although not shown, when a decrease in pressure occurs within the nozzle body 12 membrane 22B expands so the final volume is volume 28 plus volume 29.

Figure 5:
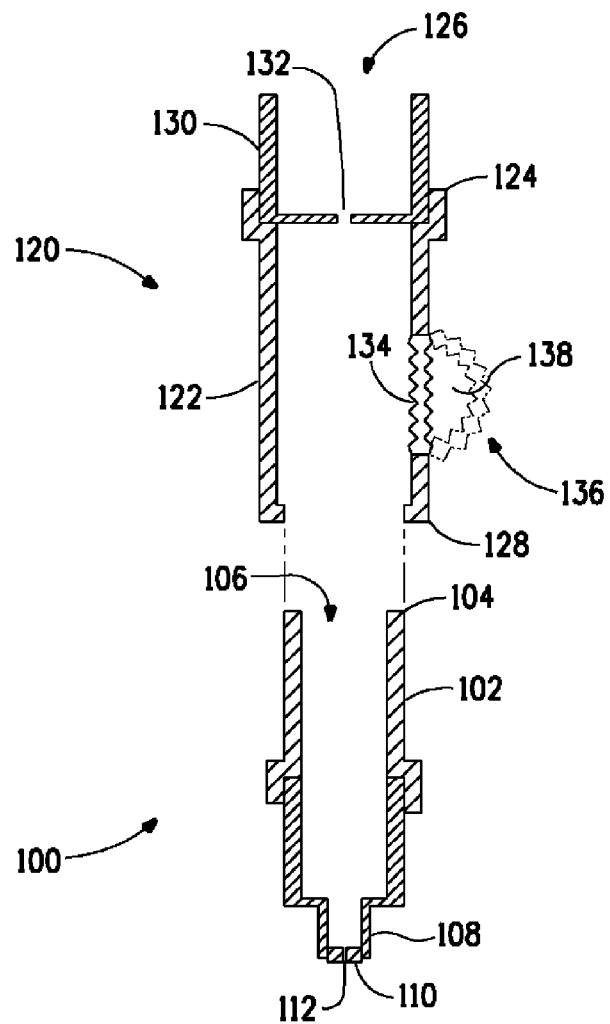
FIG. 5 represents an embodiment of the present invention with a damping module in conjunction with a nozzle assembly.

FIG. 5 represents at least one embodiment where a nozzle assembly 100 is used in conjunction with a damping module 120 to deposit a liquid ink onto a surface (not shown) as the nozzle assembly 100 is displaced with respect to the surface, motion of the nozzle assembly 100 and damping module 120 acting to impose pressure variations within a liquid ink being supplied to the nozzle assembly 100 and the damping module 120. The nozzle assembly 100 contains a nozzle body 102 having a disc 110 at or near one end 108 of the nozzle assembly 100 with this disc 110 having an opening 112, the opening 112 in at least one embodiment located in the center of the disc 110. At a second end 104 of the nozzle assembly 100 is located an entrance 106 where entrance 106 is opposite end 108 of the nozzle assembly 100.

The damping module 120 contains a housing 122, the housing 122 has a first end 124 and a second end 128. The second end 128 of the housing 122 is connectable to the entrance 106 of nozzle assembly 100. The first end 124 of the housing 122 has an inlet opening 126, where the first end 124 of the housing 122 is connectable to a supply of liquid ink (not shown). A throttle plate 130 is attached to the housing 122 at a location between the first end 124 and second end 128 of the housing 122.

The throttle plate 130 contains a passage 132; this passage 132 can have fixed dimensions, or in at least one embodiment a variable dimension using a set screw (not shown) to adjust the dimensions of passage 132. In addition, the throttle plate 130 may be removable from the housing 122; different throttle plates 130 each having a distinct passage 132 may be used to accommodate different liquid inks used in a printing operation utilizing the nozzle assembly 100 and damping module 120.

The damping module 120 has a flexible portion 134, the flexible portion 134 being positioned between the throttle plate 130 and the second end 128 of the housing 122. The flexible portion 134 may be a thin portion of housing 122 capable of being expanded to a position 136 in response to a pressure variation in the liquid ink. In at least one embodiment the flexible portion 134 is an annular member which may occupy some, or the entire, circumference of the housing 122. The difference between original position of flexible portion 134 and expanded position 136 defining an accumulation space 138 within the damping module 120 whereby the throttling action by the throttle plate 130 coupled with the definition of the accumulation space 138 being operable to mitigate pressure variations in the liquid ink.

By extension the embodiments for flexible portion 22 shown in FIGS. 1-4 are equally applicable to flexible portion 134 of damping module 120.

Description of Electronic Device

Devices for which the printing method described herein can be used include organic electronic devices. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

In such devices, an organic active layer is sandwiched between two electrical contact layers. At least one of the electrical contact layers is light-transmitting so that light can pass through the electrical contact layer. The organic active layer emits light through the light-transmitting electrical contact layer upon application of electricity across the electrical contact layers. Additional electroactive layers may be present between the light-emitting layer and the electrical contact layer(s).

It is well known to use organic electroluminescent compounds as the active component in such devices to provide the necessary colors. The printing method described herein is suitable for the printing of liquid compositions containing electroluminescent materials having different colors. Such materials include, but are not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly(spirobifluorenes), polythiophenes, poly(p-phenylenes), copolymers thereof, and mixtures thereof.

To form the printing inks, the above materials are dissolved or dispersed in a suitable liquid composition. A suitable solvent for a particular compound or related class of compounds can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the liquid composition, either as a solution or dispersion as described herein, comprising the new compounds, includes, but not limited to, chlorinated hydrocarbons (such as methylene chloride, chloroform, chlorobenzene), aromatic hydrocarbons (such as substituted and non-substituted toluenes and xylenes), including triflurotoluene), polar solvents (such as tetrahydrofuran (THP), N-methyl pyrrolidone) esters (such as ethylacetate) alcohols (isopropanol), keytones (cyclopentatone) and mixtures thereof. Suitable solvents for photoactive materials have been described in, for example, published PCT application WO 2007/145979.

The OLED device has a first electrical contact layer, which is an anode layer, and a second electrical contact layer, which is a cathode layer. A photoactive layer is between them. Additional layers may optionally be present. Adjacent to the anode may be a buffer layer. Adjacent to the buffer layer may be a hole transport layer, comprising hole transport material. Adjacent to the cathode may be an electron transport layer, comprising an electron transport material. As an option, devices may use one or more additional hole injection or hole transport layers next to the anode and/or one or more additional electron injection or electron transport layers next to the cathode.

It should be appreciated from the foregoing description that the present invention serves to locate a flexible portion in a nozzle assembly, or alternatively a damping module, in conjunction with a throttle plate for liquid printing. This combination of a resistive throttling plate in conjunction with capacitive volume having a flexible portion mitigates pressure variations during continuous printing operations and improves printing uniformity and quality. Non-uniform deposition of the liquid on the substrate causes performance irregularities in the dried liquid, and consequently poor performance of the electronic device produced from the printed and subsequently dried liquid.

Those skilled in the art, having the benefit of the teachings of the present invention, may impart modifications thereto. Such modifications are to be construed as lying within the scope of the present invention, as defined by the appended claims.

What is claimed is:

1. A nozzle assembly for a printing apparatus having a movable printing head, the nozzle assembly being adapted to deposit a liquid ink onto a surface as the printing head is displaced with respect to the surface, motion of the printing head acting to impose pressure variations within a liquid ink being supplied to the nozzle assembly, the nozzle assembly comprising:
   a nozzle body;
   a nozzle disc supported by the nozzle body at a predetermined position therein, the nozzle disc having a nozzle opening,
   a throttle plate mounted in the nozzle body at a location spaced from the nozzle disc, the throttle plate having a passage therein, the passage in the throttle plate being in fluid communication with the nozzle body, the throttle plate being operative to impart a throttling action on a flow of liquid ink passing into the nozzle body;
   the nozzle body having a flexible portion, the flexible portion being positioned between the nozzle disc and the throttle plate, the flexible portion being able to define an accumulation space within the nozzle body in response to a pressure variation in the ink,
   whereby, the throttling action by the throttle plate coupled with the definition of the accumulation space being operable to mitigate pressure variations in a liquid ink.

2. The nozzle assembly of claim 1 wherein the flexible portion forms part of the nozzle body between the nozzle disc and the throttle plate.

3. The nozzle assembly of claim 2 wherein the flexible portion is integral with and defined by a thinner region of the material of the nozzle body.

4. The nozzle assembly of claim 3 wherein the flexible portion is an annular member.

5. The nozzle assembly of claim 1 wherein the flexible portion is separate from but connected to the nozzle body.

6. The nozzle assembly of claim 1 wherein the flexible portion comprises a membrane attached to the interior surface of the nozzle body, the membrane and the surface of the nozzle body cooperating to define a closed volume having a compressible gas therein.

7. The nozzle assembly of claim 1 wherein the flexible portion comprises a separate member mounted within the nozzle body, the separate member enclosing a volume, the volume having a compressible gas therein.

8. The nozzle assembly of claim 7 wherein the compressible gas is an inert gas.

9. The nozzle assembly of claim 7 wherein the separate member is annular.

10. The nozzle assembly of claim 1 wherein the dimension of the passage in the throttle plate is adjustably selectable.

* * * * *